INVENTOR
WALTER E. MUTTER
BY Everett A. Gastell
ATTORNEY

Dec. 4, 1962 W. E. MUTTER 3,067,071

SEMICONDUCTOR DEVICES AND METHODS OF APPLYING METAL FILMS THERETO

Filed Jan. 4, 1960 2 Sheets-Sheet 2

United States Patent Office 3,067,071
Patented Dec. 4, 1962

3,067,071

SEMICONDUCTOR DEVICES AND METHODS OF APPLYING METAL FILMS THERETO

Walter E. Mutter, Poughkeepsie, N.Y., assignor to International Business Machines Corporation, New York, N.Y., a corporation of New York Filed Jan. 4, 1960, Ser. No. 154
3 Claims. (Cl. 148—1.5)

Figure 1A:
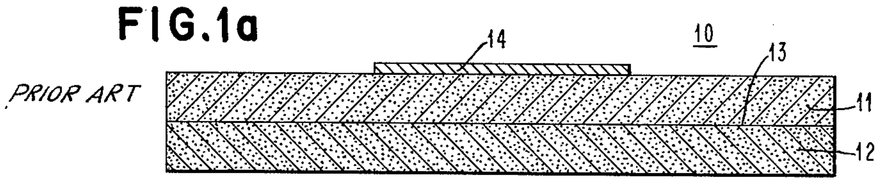

The present invention relates to semiconductor devices and to the methods of applying metal films thereto. In particular, the invention is directed to the formation of electrical terminals on semiconductor devices and to the formation of rectifying junctions therein by the alloying of relatively thin conductive metal films to the semiconductor bodies in a manner which prevents the conductive films from undesirable balling up on those bodies during the alloying or fusing operation. The problem of the metal films balling up on the wafers will be considered in detail subsequently.

Semiconductor devices having rectification barriers therein are sometimes referred to as PN junction devices. The PN junctions thereof comprise zones of P-type and N-type semiconductor material separated by a rectification barrier which has a high resistivity to electrical current flowing in one direction and a low resistivity to such flow in the opposite direction. Semiconductor diodes and transistors are two types of semiconductor devices, the diode having a single PN junction while the transistor has two or more such junctions.

PN junction devices may be made in a variety of ways. In accordance with a known procedure involving a diffusing operation, the regions of different conductivity and the PN junction therebetween are formed by evaporating on a semiconductor body or wafer of a given conductivity type a very thin film of an active impurity metal having a thickness such as about 0.0002 mil. The assembly is then heated to an elevated temperature for several hours to permit the impurity to diffuse into the wafer without any significant melting of the wafer, thereby creating a region of the opposite conductivity type and the PN junction. In the diffusing operation, the metal film is so thin that it disperses into the semiconductor body without balling up on the surface and imparing the usefulness of the device.

Pursuant to another method, known as the alloy or fusion process, a pellet or dot of an active impurity or an active impurity in a carrier metal is alloyed at an elevated temperature to a body of semiconductor metal which is of a conductivity type opposite to that imparted by the pellet. In this alloying operation, a portion of the semiconductor body under the pellet melts and alloys with the impurity. The thickness of the pellet of the active impurity is about 0.01 inch, and it has been found that this is sufficiently great that a balling problem is not encountered.

For some applications it is desirable either to affix a terminal to a semiconductor body or to form a PN junction device by alloying a thin metal film to a body of crystalline semiconductor metal such as germanium, silicon, a germanium-silicon alloy, or intermetallic compounds such as indium antimonide, aluminum arsenide, and aluminum antimonide. Heretofore, efforts to alloy metal films having thicknesses within the range of about 0.005 to 1.0 mil to such semiconductor bodies have not met with consistent success, particularly with metals such as aluminum, silver, gold, lead, tin, and antimony which do not readily wet the semiconductor body uniformly. It is believed that at the alloying temperature, the surface tension of the liquid metal film exceeds the interfacial tension between the liquid and the solid semiconductor substrate. When this takes place, a plurality of discrete metal balls or hemispheres are created on the substrate. Since molten indium has the property of rather readily wetting the semiconductor material thereunder, the surface tension of the liquid indium is sufficiently low that the indium does not ball up to the same extent as do the other metals just mentioned. However, some undesired balling may occur. When the device cools, the resulting terminal or alloy junction, as the case may be, has inferior electrical properties which may impair or render the device useless for its intended purpose.

It is an object of the invention, therefore, to provide a new and improved method of alloying a thin metal film with a semiconductor body.

It is another object of the invention to provide a new and improved method of alloying a thin metal film with a semiconductor body, which method consistently produces junction devices having uniform and reliable electrical characteristics.

It is a further object of the invention to provide a new and improved method of forming a PN alloy junction from thin metal films deposited on semiconductor bodies.

It is a still further object of the invention to provide a new and improved method of alloying a conductivity-determining metal film having a thickness within a range of 0.005 to 1.0 mil to a germanium semiconductor body.

It is yet another object of the invention to provide a new and improved method of alloying a thin metal film to a semiconductor body, which method is simple, inexpensive, and reliable.

It is an additional object of the invention to provide a new and improved method of alloying a thin metal film to a semiconductor body while avoiding the undesirable ballup effect heretofore encountered with prior alloying procedures involving such films.

It is also an object of the present invention to provide a new and improved alloy-junction type of semiconductor device.

It is also an object of the present invention to make an ohmic contact between a thin metal film and a semiconductor body.

It is a further object of the invention to provide a new and improved semiconductor device having a sturdy, reliable, uniform connection between a thin film and the semiconductor body.

In accordance with a particular form of the present invention, the method of making an alloy-junction semiconductor device comprises coating a portion of a semiconductor body of a given conductivity type with a metal film which is of the opposite conductivity type and is volatile at the alloying temperature of the body and the film and has a thickness within the range of 0.005 to 1.0 mil. The method further comprises evaporating on the aforesaid film and on the surface of the body adjoining that film, so as to enclose the film completely, a continuous, coherent film of silicon monoxide. The method also includes heating the body and the films to a temperature and for a period sufficient to alloy the metal film with the coated portion of the surface of the body and to form a PN junction without creating discontinuities in the alloyed portion, the silicon monoxide film being effective during the alloying to prevent the escape of the aforesaid volatile metal and the formation thereby on the uncoated surface of the body of an unwanted semiconductor skin of the opposite conductivity type.

The foregoing and other objects, features and advantages of the invention will be apparent from the following more particular description of a preferred embodiment of the invention, as illustrated in FIG. 2 of the accompanying drawings.

Figure 1B:
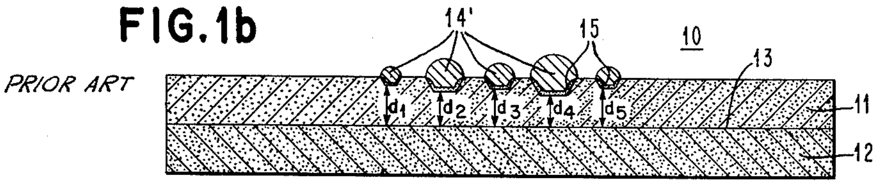
Figure 1C:
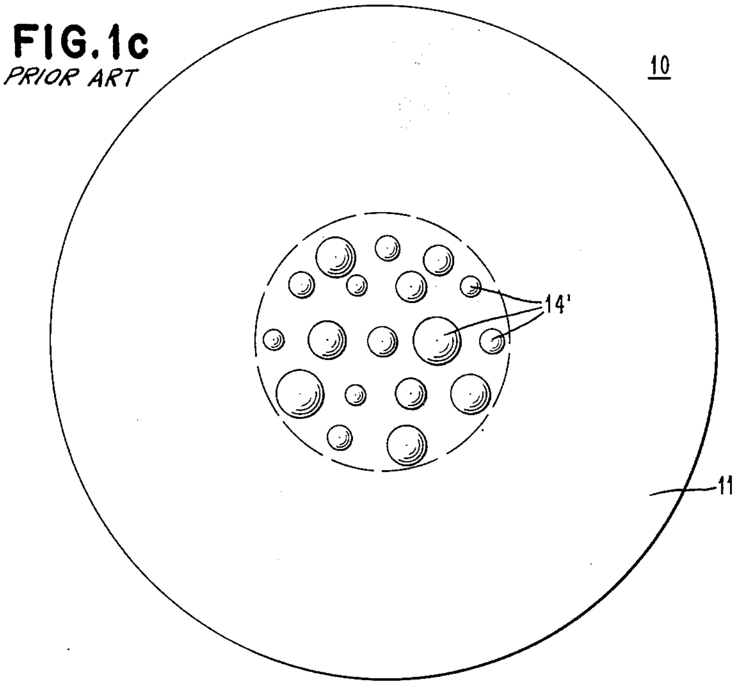
Figure 2A:
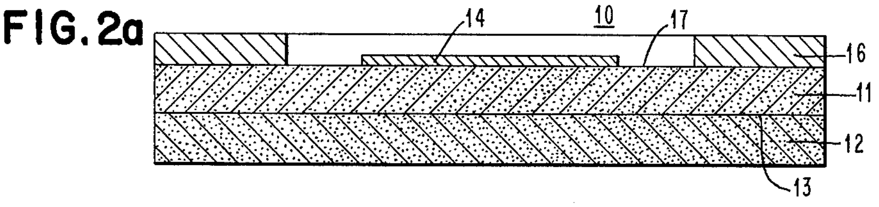
Figure 2B:
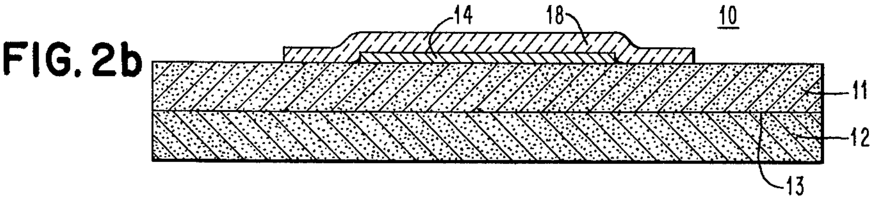
Figure 2C:
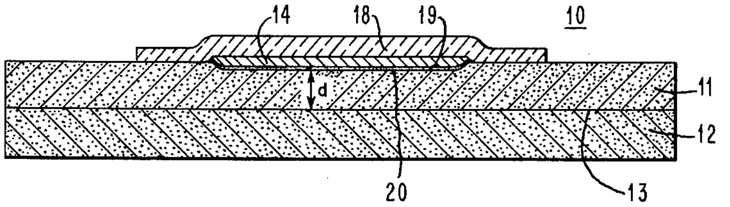
Figure 2D:
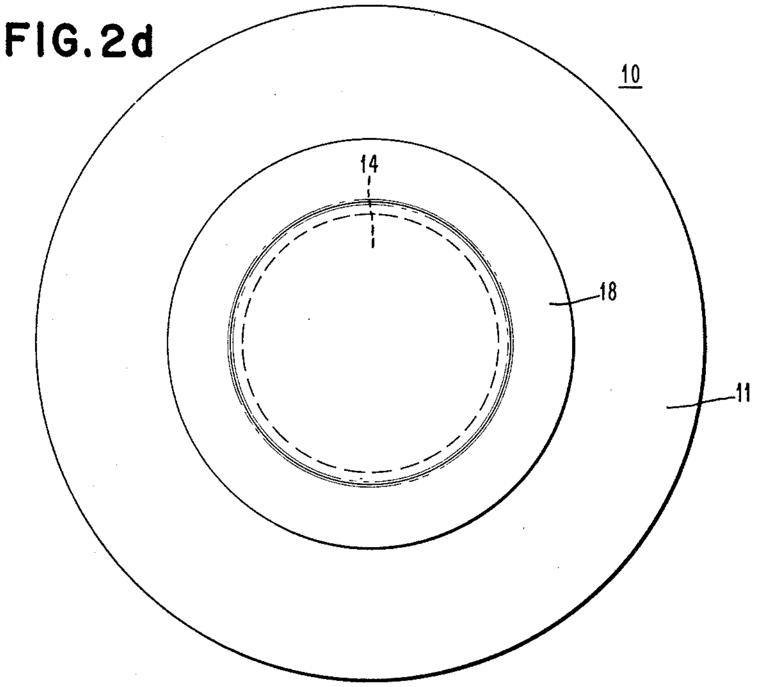

In the drawings:

FIGURE 1*a* is a cross-sectional view of a semiconductor device after an intial step in the manufacture of the device in accordance with a prior-art procedure;

FIGURE 1*b* is a similar view of the device after a subsequent prior-art procedure;

FIGURE 1*c* is a top plan view of the device represented in FIGURE 1*b*;

FIGURE 2*a* is a sectional view of a semiconductor device after an initial step in the manufacture of the device in accordance with the present invention;

FIGURE 2*b* is a similar view of the device subsequent to another step in the manufacture of the device according to the present invention;

FIGURE 2*c* also is a similar view representing a subsequent step in the manufacture of the device in accordance with the invention; and FIGURE 2*d* is a top plan view of the device represented in FIGURE 2*c*.

*Prior-Art Film Applying Procedure*

For greater ease in understanding the advantages of the method of the present invention for applying or alloying a thin metal film to a semiconductor body, it will be helpful to consider first the prior-art method of performing that operation. In FIG. 1*a* there is represented a greatly enlarged view of a semiconductor body 10 which has a pair of zones 11 and 12 of opposite conductivity types separated by a rectification barrier or PN junction 13. It will be understood, however, that the body 10 may comprise a single zone of a given conductivity type such as when the semiconductor device to be fabricated is to constitute a semiconductor diode. In the FIG. 1*a* embodiment, the zone 11 may, for example, be established in the well known manner by diffusing into a semiconductor body or wafer having the same conductivity as the zone 12, a conductivity-determining impurity which is effective to create the barrier 13 and the zone 11 of the opposite conductivity type. Next a thin metal film 14 of a suitable metal having a thickness within the range of 0.005 to 1.0 mil is applied to the exposed surface of zone 11 by any well-known means such as by vacuum evaporation. The thickness of this film is usually determined partially by the depth of penetration desired. This film 14 may be a suitable material such as antimony, arsenic, or indium, depending upon whether an N-type or a P-type recrystallized region is desired in connection with a subsequent alloying operation.

The assembly of FIG. 1 is then introduced for several minutes into an alloying furnace maintained at a temperature above the eutectic temperature of the metal film 14 and the semiconductor material. Upon melting, the metal film 14 unfortunately separates into a plurality of discrete balls or globules 14' of different sizes as represented in FIGS. 1*b* and 1*c*. This ball-up effect is believed to occur because the surface tension of the liquid metal film exceeds the interfacial tension between the liquid and the solid semiconductor material of zone 11. The balls 14' melt the semiconductor region immediately underneath each thereof and when they cool, a plurality of PN junctions and recrystallized regions 15 of a conductivity type opposite to that of the semiconductor region 11 results. It will be noted that the balls 14' are of several different sizes. Consequently, the base portions of those dots, which coincide with the PN junctions, are spaced a variety of different distances from the PN junction 13, such as the distances $d_1$, $d_2$, $d_3$, $d_4$, $d_5$ as represented in FIG. 1*b*. This unequal spacing of the junctions not only makes it difficult to fabricate transistors having substantially identical electrical characteristics, but also presents difficulties in attaching a terminal connection to the group of discrete dots. Accordingly, there has existed a need in the art for a method of making a more reliable alloy connection or a PN junction when a thin metal film having a thickness within the range of 0.005 to 1.0 mil is alloyed to a semiconductor body.

*Film-Applying Procedure of the Present Invention*

The difficulties explained above may be obviated by practicing the improved method of the invention, which will now be explained in connection with FIGS. 2*a*–2*d*. Elements in those figures corresponding to elements in FIGS. 1*a*–1*c* are designated by the same reference characters. It will be understood that the semiconductor body 10 may be made of germanium, silicon, a germanium-silicon alloy, or an intermetallic material. The zone 11 has a portion of its exposed surface coated, as by a conventional vacuum evaporation or other suitable operation, with a suitable metal film 14 having a thickness within the range of 0.005 to 1.0 ml. A typical film which has been employed with considerable success has a thickness of 0.01 mil and a diameter within the range of 5 to 10 mils. Prior to the alloying operation, a metal mask 16 of suitable material and configuration, such as the annular one represented in FIG. 2*a*, is placed on the exposed surface of zone 11 so that it surrounds the film 14 but does not engage it. Next there is deposited through the opening in the mask 16 of the metal film 14 and on the surface 17 of the zone 11 adjoining the metal film a continuous coherent film 18 of a material selected from the class of silicon and an inorganic compound of silicon. This continuous film 18 is deposited in a suitable manner as by evaporating the material just mentioned in an evacuated chamber through the opening in the annular mask 16. One convenient way is to energize a filament coated with the material so as to heat the filament to a temperature of about 1600° C., whereupon the coating material evaporates or sublimes and then condenses, as a thin tough film 18 that covers and is intimately bonded to both the metal coating 14 and the adjoining surface 17 of the zone 11 leaving the structure represented in FIG. 2*b* after removal of the mask 16. During this operation the semiconductor body 10 and the metal film 14 remain at a temperature which is well below the alloying temperature of the two.

The film 18 serves to anchor the metal film 14 to the adjoining surface 17 for a purpose to be explained subsequently. Film 18 may have a thickness of about 0.1 to 1.0 mil, 0.2 to 0.4 mil being a thickness range which has been employed with exceptional success. Experience has indicated that when the film 18 has a film thickness equal to or greater than about 1.0 mil, it has a tendency to crack when heated suddenly.

The film 18 may be silicon monoxide, a mixture of silicon monoxide and silicon dioxide, or the mixture may even contain some silicon. As employed in this application, the term silicon oxide will be used to designate the materials just mentioned as well as a material selected from the class consisting silicon and an inorganic compound of silicon. A suitable material, which is believed to be of the mixed oxide form, is sold as silicon monoxide by the Kemet Company, a division of Union Carbide and Carbon Corporation, of 30 E. 42nd Street, New York, New York and also by Vacuum Equipment, a division of the New York Air Brake Company, of 1325 Admiral Wilson Boulevard, Camden 1, New Jersey.

In the next step wherein the metal film 14 is applied or alloyed to the semiconductor body 10, the body and the films 14 and 18 are heated to a temperature and for a period sufficient to alloy the metal film to the zone 11 of the body 10. This is accomplished in the well-known manner by heating the unit above the eutectic temperature of the body and the metal film for a few minutes in a reducing or inert atmosphere in an alloying furnace. If, for example, the metal film 14 is made of a silver-antimony alloy, the unit may be heated to a temperature of 700° for 2 to 5 minutes, which temperature is well below the melting temperature of the silicon oxide film 18.

FIG. 2*c* represents to a greatly enlarged scale the metal film 14 after it has alloyed with the zone 11. During the alloy operation, the silicon oxide film 18 served as a tough restraining cover which resisted the surface tension forces that were created by the film 14 when the latter was molten, and thereby prevented the unwanted balling of the type represented in FIGS. 1*b* and 1*c*. Accordingly, the alloy penetration into the semiconductor zone 11 is uniform over the entire area of the metal film 14 as represented in FIG. 2*c*.

It will be seen that a uniform spacing *d* results between the junction 13 and the lower or base portion 19 of the alloyed film 14. When that film is a conductivity-determining impurity different from the predominant impurity in the zone 11, the base portion 19 constitutes a recrystallized region separated from zone 14 by a rectification barrier 20 which has the desired uniform spacing *d* from the other rectification barrier 13. Such a spacing in turn assures that a large number of semiconductive devices made in accordance with the described procedure will have substantially identical electrical characteristics.

When suitable metal films such as silver or tin are used, the silicon oxide film may be removed by dissolving it in hydrofluoric acid, thereby exposing the film 19 which may be employed as a terminal for making an electrical connection to the zone 12 when the recrystallized portion 19 is of the same conductivity type as zone 11. Alternatively, when portion 19 and zone 14 are of oppostie conductivity types, the exposed film 14 may serve as the terminal for portion 19, which may constitute the emitter region of a transistor having a graded base zone 11 and a collector zone 12. Manifestly, terminals may be affixed in a conventional manner to zones 11 and 12.

The use of the silicon monoxide film 18 in the fabrication of the device presents a number of additional benefits. Some conductivity-determining impurities such as antimony have coefficients of linear expansion which are considerably different from that of a semiconductor such as germanium. To create an expansion coefficient compatible with that of germanium, a carrier metal such as lead has heretofore been alloyed with the antimony to form a pellet which is in turn alloyed with the germanium starting body or wafer. The use of the constraining silicon oxide film 18 as described above together with the thin film of relatively pure antimony results in an antimony-doped germanium alloy region and an alloy junction which are relatively stress free. When the volatile group V elements such as arsenic are used as the metal film 14, the silicon monoxide film 18 placed thereover precludes the loss of the volatile material during the alloying operation. This in turn avoids the formation over the semiconductor device of unwanted N-type skins which would impair the electrical characteristics and the performance of the device. A silicon monoxide film 18 also restricts the metal film 14 from spreading toward the peripheral edge of the device when the metal film becomes molten during the alloying operation. Thus the area or geometry of the alloy region can be accurately controlled, this being a difficult problem in making a semiconductor device or small dimensions. The silicon oxide film may also serve as a chemical resist when it is desirable to etch particular regions of the semiconductor device with acids other than hydrofluoric acid.

While the invention has been particularly shown and described with reference to a preferred embodiment thereof, it will be understood by those skilled in the art that various changes in form and details may be made therein without departing from the spirit and scope of the invention.

What is claimed is:

1. The method of making an alloy-junction semiconductor device comprising:

coating a portion of a surface of a semiconductor body of a given conductivity type with a metal film which is of the opposite conductivity type and is volatile at the alloying temperature of said body and said film and has a thickness within the range of 0.005 to 1.0 mil;

evaporating on said film and on the surface of said body adjoining said film, so as to enclose said film completely, a continuous, coherent film of silicon monoxide; and heating said body and said films to a temperature and for a period sufficient to alloy said metal film with said coated portion of said surface of said body and to form a PN junction without creating discontinuities in the alloyed portion, said silicon monoxide film being effective during said alloying to prevent the escape of said volatile metal and the formation thereby on the uncoated surface of said body of an unwanted semiconductor skin of said opposite conductivity type.

2. The method of making an alloy-junction semiconductor device comprising:

coating a portion of a surface of a P-type semiconductor body with a metal film of group V of the periodic system which is volatile at the alloying temperature of said body and said film and has a thickness within the range of 0.005 to 1.0 mil;

evaporating on said film and on the surface of said body adjoining said film, so as to enclose said film completely, a continuous, coherent film of silicon monoxide having a thickness in the range of 0.1 to 1.0 mil; and heating said body and said films to a temperature and for a period sufficient to alloy said metal film with said coated portion of said surface of said body and to form a PN junction without creating discontinuities in the alloyed portion, said silicon monoxide film being effective during said alloying to prevent the escape of said volatile metal and the formation thereby on the uncoated surface of said body of an unwanted N-type semiconductor skin.

3. The method of making an alloy-junction semiconductor device comprising:

coating a portion of a surface of a P-type semiconductor body with an arsenic film which is volatile at the alloying temperature of said body and said film and has a thickness within the range of 0.005 to 1.0 mil;

evaporating on said film and on the surface of said body adjoining said film, so as to enclose said film completely, a continuous, coherent film of silicon monoxide; and heating said body and said films above the eutectic temperature of said body and said film for a period sufficient to alloy said metal film with said coated portion of said surface of said body and to form a PN junction without creating discontinuities in the alloyed portion, said silicon monoxide film being effective during said alloying to prevent the escape of said volatile arsenic and the formation thereby on the uncoated surface of said body of an unwanted N-type semiconductor skin.

References Cited in the file of this patent

UNITED STATES PATENTS

| | | |
|---|---|---|
| 2,785,095 | Pankove | Mar. 12, 1957 |
| 2,844,770 | Van Vessem | July 22, 1958 |
| 2,887,633 | Shilliday | May 19, 1959 |
| 2,931,743 | Rittmann | Apr. 5, 1960 |